United States Patent
Yeo et al.

(10) Patent No.: US 9,177,841 B2
(45) Date of Patent: Nov. 3, 2015

(54) COATING SLIT APPARATUS FOR COATING A SUBSTRATE AND METHOD FOR COATING USING THE SAME

(71) Applicant: Samsung Display Co., Ltd., Yongin-si (KR)

(72) Inventors: Gil-Hwan Yeo, Hwaseong-si (KR); Dong-Hwan Kim, Asan-si (KR); Sung-Ku Baek, Suwon-si (KR); Chan-Uk Jon, Seoul (KR); Il-Sup Choi, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 36 days.

(21) Appl. No.: 13/624,211

(22) Filed: Sep. 21, 2012

(65) Prior Publication Data

US 2013/0260045 A1 Oct. 3, 2013

(30) Foreign Application Priority Data

Apr. 3, 2012 (KR) .................. 10-2012-0034189

(51) Int. Cl.

| | |
|---|---|
| *B05B 7/06* | (2006.01) |
| *B05C 11/10* | (2006.01) |
| *B05C 5/02* | (2006.01) |
| *B05D 1/26* | (2006.01) |
| *H01L 21/67* | (2006.01) |
| *B05B 7/02* | (2006.01) |
| *G03F 7/16* | (2006.01) |
| *G09G 3/34* | (2006.01) |
| *B05C 11/00* | (2006.01) |
| *B05B 7/08* | (2006.01) |
| *B05C 9/02* | (2006.01) |
| *G02B 26/00* | (2006.01) |

(52) U.S. Cl.
CPC .......... *H01L 21/6715* (2013.01); *B05B 7/025* (2013.01); *B05C 5/027* (2013.01); *B05C 5/0254* (2013.01); *B05C 11/1036* (2013.01); *G03F 7/16* (2013.01); *G09G 3/348* (2013.01); *B05B 7/061* (2013.01); *B05B 7/0876* (2013.01); *B05C 9/02* (2013.01); *B05C 11/00* (2013.01); *G02B 26/005* (2013.01)

(58) Field of Classification Search
None
See application file for complete search history.

(56) References Cited

U.S. PATENT DOCUMENTS

| | | | | |
|---|---|---|---|---|
| 4,246,335 | A * | 1/1981 | Keogh et al. .................. | 118/415 |
| 4,445,458 | A * | 5/1984 | O'Brien ........................ | 118/401 |
| 4,748,057 | A * | 5/1988 | Kageyama et al. ........... | 118/410 |
| 5,067,432 | A * | 11/1991 | Lippert ......................... | 118/413 |
| 5,072,688 | A * | 12/1991 | Chino et al. .................. | 118/411 |
| 6,602,382 | B1 * | 8/2003 | Matsuyama et al. ..... | 156/345.11 |
| 6,991,682 | B2 * | 1/2006 | Moss et al. .................... | 118/407 |
| 2003/0134044 | A1 * | 7/2003 | Aoki et al. .................... | 118/100 |
| 2005/0082397 | A1 * | 4/2005 | Heo .............................. | 239/596 |

FOREIGN PATENT DOCUMENTS

WO WO 2005098797 A2 * 10/2005

* cited by examiner

*Primary Examiner* — Dah-Wei D Yuan
*Assistant Examiner* — Binu Thomas
(74) *Attorney, Agent, or Firm* — H.C. Park & Associates, PLC

(57) ABSTRACT

An exemplary embodiment of the present invention discloses a coating apparatus including a stage configured to receive a substrate and a coating slit part. The coating slit part includes a guide member, a first body, a second body, and a discharge nozzle. The coating slit part is configured to dispose a coating material on the substrate.

8 Claims, 7 Drawing Sheets

COATING SLIT APPARATUS FOR COATING A SUBSTRATE AND METHOD FOR COATING USING THE SAME

This application claims priority from and the benefit of Korean Patent Application No. 10-2012-0034189, filed on Apr. 3, 2012, which is hereby incorporated by reference for all purposes as if fully set forth herein.

BACKGROUND

1. Field

Exemplary embodiments of the present invention relate to an apparatus for coating and a method for coating using the apparatus. More particularly, exemplary embodiments of the present invention relate to an apparatus for coating using a coating slit and a method for coating using the apparatus.

2. Discussion of the Background

An electro wetting display ("EWD") has recently been introduced for use as a is display apparatus. The EWD uses the characteristics of oil and water, which do not mix with each other. The oil may be provided in a display panel, and a voltage applied to the electrically conductive water, so that the oil may be controllably gathered or spread by the applied voltage. When the voltage is not applied, the oil may cover the entire of an insulation layer and the color of the oil may be displayed. When the voltage is applied, the oil may be gathered near the insulation layer and light transmitted or reflected through the area where the oil has been removed. Thus, according to the moving amount of the oil, contrast ratio may be adjusted and a color displayed.

In order to manufacture the EWD, an electrolyte including water may be disposed on an oil layer in a thin film transistor ("TFT") substrate. Since the oil layer may float above the electrolyte layer in a normal condition, in order to displace the oil layer under the electrolyte layer, the oil layer may be formed in a tank, which is filled with the electrolyte. The electrolyte layer may be formed on a substrate by slowly moving the substrate along the slope of the tank.

Using such a manufacturing process, the layers may be formed on the substrate by a few millimeters per second. Thus, mass production may not be adaptable. In order to produce the EWD at a faster manufacturing speed, another faster manufacturing concept may be needed.

SUMMARY OF THE INVENTION

Exemplary embodiments of the present invention provide a coating apparatus for coating a substrate and a method for coating using the apparatus.

Additional features of the invention will be set forth in the description which follows, and in part will be apparent from the description, or may be learned by practice of the invention.

An exemplary embodiment of the present invention discloses a coating apparatus including a stage configured to receive a substrate and a coating slit part. The coating slit part includes a guide member, a first body, a second body, and a discharge nozzle. The coating slit is configured to dispose a coating material on the substrate.

An exemplary embodiment of the present invention also discloses a method for coating a substrate including coating an oil on a substrate and coating an electrolyte on the oil. In the step of coating the electrolyte, a coating slit part having a guide member, a first body, a second body, and a discharge nozzle is used and the electrolyte is discharged from the discharge nozzle and flows along a bottom surface of the guide member.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the principles of the invention.

DETAILED DESCRIPTION OF THE ILLUSTRATED EMBODIMENTS

Figure 1:
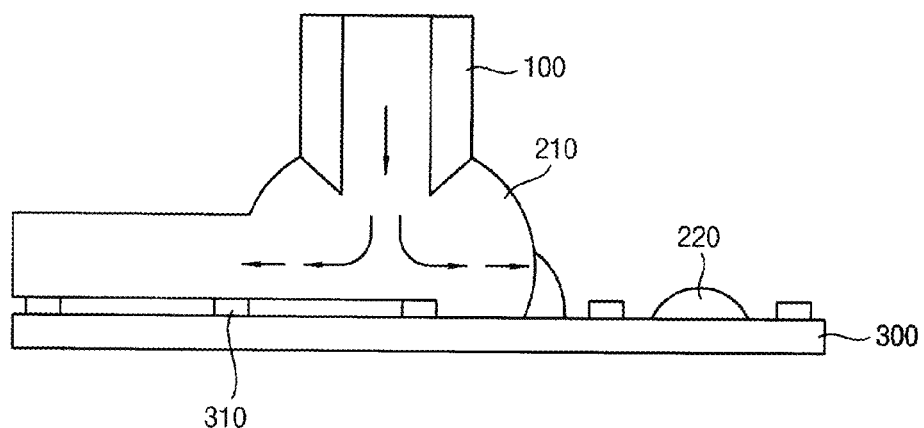
FIG. 1 is a cross-sectional view illustrating a coating apparatus according to a conventional embodiment.

The present invention is described more fully hereinafter with reference to the accompanying drawings, in which exemplary embodiments of the invention are shown. This invention may, however, be embodied in many different forms and should not be construed as limited to the exemplary embodiments set forth herein. Rather, these exemplary embodiments are provided so that this disclosure is thorough, and will fully convey the scope of the invention to those skilled in the art. In the drawings, the size and relative sizes of layers and regions may be exaggerated for clarity. Like reference numerals in the drawings denote like elements.

It will be understood that when an element or layer is referred to as being "on" or "connected to" another element or layer, it can be directly on or directly connected to the other is element or layer, or intervening elements or layers may be present. In contrast, when an element is referred to as being "directly on" or "directly connected to" another element or layer, there are no intervening elements or layers present. It will be understood that for the purposes of this disclosure, "at least one of X, Y, and Z" can be construed as X only, Y only, Z only, or any combination of two or more items X, Y, and Z (e.g., XYZ, XYY, YZ, ZZ).

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Hereinafter, the invention will be explained in detail with reference to the accompanying drawings.

Figure 2:
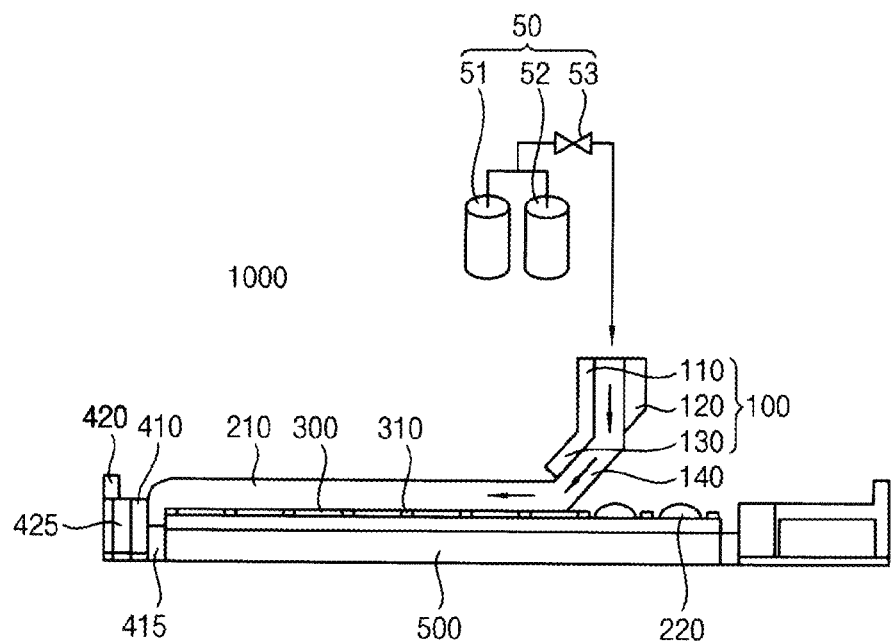
FIG. 2 is a cross-sectional view illustrating a coating apparatus according to an exemplary embodiment of the present invention.

FIG. 2 is a cross-sectional view illustrating a coating apparatus according to an exemplary embodiment of the present invention.

Referring to FIG. 2, a coating apparatus 1000 in accordance with the present exemplary embodiment includes a providing part 50, a coating slit part 100, holding walls 410, 420 and a stage 500. The providing part 50 includes storage tanks 51, 52 and an adjusting valve 53, and provides materials stored in the storage tanks 51 and 52 to the coating slit part 100. The is substrate 300 is mounted on the stage 500, and may be processed to be coated. The coating slit part 100 coats the coating material 210 provided from the providing part 50 on the substrate 300. The holding walls 410 and 420 maintain the coating material 210 at a specified height. The coating slit part 100 may move on the substrate 300 in a constant direction, and coat the coating material 210 on the substrate 300. Likewise, the coating slit part 100 may be stationary, and the substrate 300 may move in a constant direction, and the coating material 210 may be coated on the substrate 300.

The coating slit part 100 coats the provided coating material on the substrate 300. The coating slit part 100 includes a front body 110, a rear body 120, a guide member 130 and a discharge nozzle 140. The coating slit part 100 is may extend in a direction perpendicular to the moving direction of the substrate. The discharge nozzle 140 is formed by combining the front body 110 with the rear body 120. End portions of the front body 110 and the rear body 120, which are relatively close to the substrate 300, may be formed to be narrower than other portions of the front body 110 and the rear body 120, which are relatively farther from the substrate 300. The guide member 130 may be formed at the end portion of the front body 110 or the end portion of the rear body 120, and guide material, such as the coating material 210, discharged through the discharge nozzle 140 of the coating slit part 100.

The guide member 130 may be formed at the end portion of the coating slit part 100 having various shapes, and guides the materials discharged through the discharge nozzle 140. According to the present exemplary embodiment, the substrate for an EWD may be manufactured by using the coating apparatus 1000, which coats an electrolyte layer above an oil layer. The electrolyte layer includes water, and the oil layer may have characteristics allowing it to float on the water. The electrolyte layer may be formed above the oil layer in the EWD. Thus, in order to prevent the oil layer from floating above the electrolyte layer, the coating apparatus of the present exemplary embodiment may be used.

The coating slit part 100 of the present exemplary embodiment coats the coating material 210, which may include an electrolyte, provided from the providing part 50 on the substrate 300. Hereinafter, "coating material" is used interchangeably with "electrolyte" with respect to reference character 210. The substrate 300 includes a pixel partition 310 in a pixel unit for having an oil layer and an electrolyte layer. After forming a plurality of pixel partitions 310 on the substrate 300, the oil 220 is formed in the pixel partition 310. The oil 220 may be formed by various methods such as an inkjet printing.

As mentioned the above, the pixel partitions 310 are already formed on the substrate 300 according to unit TFTs, which form pixels in the substrate 300. The oil 220 is coated inside the pixel partitions 310 on the substrate 300. The oil 220 inside the pixel partitions 310 may be pushed away or displaced by the electrolyte 210 if it is provided from above. As shown in FIG. 1, in a conventional coating slit part 100 without a guide member, the electrolyte 210 may form an arch-shaped cover or bead-shaped droplet due to surface tension with the coating slit part 100, as well as gravity, the oil 220 inside the pixel partitions 310 may be pushed away or displaced by a high incidence angle of the electrolyte 210 (i.e., the angle between the substrate 300 and the electrolyte 210), and the electrolyte 210 alone may be positioned inside each pixel partition 310. However, according to the present exemplary embodiment, the incidence angle of the electrolyte 210 with respect to the substrate 300 becomes smaller due to the surface tension of the electrolyte 210 with the guide member 130, and thus the electrolyte 210 may coat the oil 220 inside each pixel partition 310.

The holding walls 410 and 420 help to lower the height of the electrolyte 210 is coated on the substrate 300. The electrolyte layer 210 includes water, and may have an arched center part from surface tension. Thus, the electrolyte layer 210 may have different heights at the center part of the substrate 300 and the peripheral part of the substrate 300. When electrolytes are supplied in order to have a proper height of the electrolyte 210 at the peripheral part of the substrate 300, the electrolyte 210 may overflow out of the substrate 300. Thus, the holding walls 410 and 420 hold the electrolyte 210 at a proper height on the substrate 300.

FIG. 3A, FIG. 3B, FIG. 3C, FIG. 3D, and FIG. 3E are cross-sectional views illustrating a coating slit part according to exemplary embodiments of the present invention.

Figure 3A:
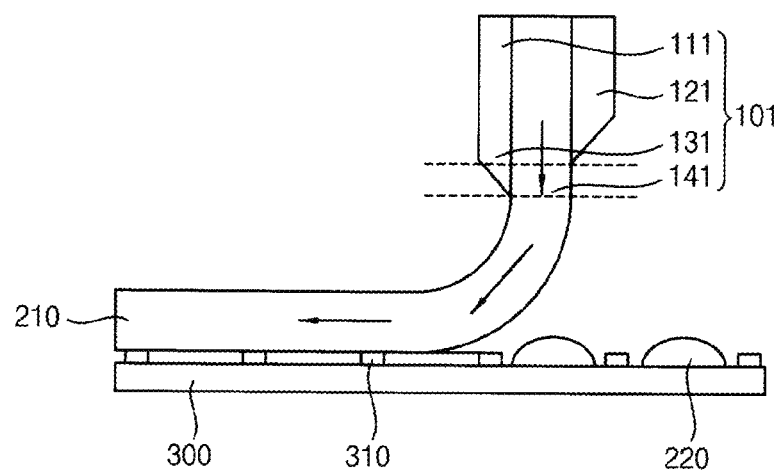
FIG. 3A, FIG. 3B, FIG. 3C, FIG. 3D, and FIG. 3E are cross-sectional views is illustrating a coating slit part according to an exemplary embodiment of the present invention.

Referring to FIG. 3A, the coating slit part 101 includes a front body 111, a rear body 121, a guide member 131 and a discharge nozzle 141. The coating slit part 101 coats electrolyte provided from the providing part on the substrate 300. The electrolyte 210 provided from the discharge nozzle 141 of the coating slit part 101 forms a layer extended in a direction where the coating slit part 101 moves, and is coated on the substrate 300. The coating slit part 101 is extended in a direction substantially perpendicular to the moving direction. Thus, the electrolyte 210, which discharged through the discharge nozzle 141 of the coating slit part 101, forms one layer over the substrate 300.

The guide member 131 may be formed at an end portion of the front body 111 of the coating slit part 101. In the present exemplary embodiment, the guide member 131 may be formed at an end portion of the front body 111 or the front body 111 may be extended toward the substrate 300. The coating slit part 101 may include the end portion of the front body 111 or the guide member 131, which has a height closer to the substrate 300 than the end portion of the rear body 121. In the present exemplary embodiment, the guide member 131 formed at this lower height than the height of the end portion of the rear body 121 will be described.

When the guide member 131 is formed at the end portion of the front body 111, the electrolyte 210 has a further holding distance by the guide member 131. The electrolyte 210 contains water and has a surface tension with the guide member 131, and the incidence angle of the electrolyte 210 with respect to the substrate 300 may be decreased when the electrolyte 210 flows along the guide member 131 than when the electrode 210 flows directly out of the discharge nozzle 141. Normally, when the guide member 131 is not formed as part of the coating slit part 101, the electrolyte 210 may flow in a substantially vertical direction with respect to the substrate 300 at the meeting point of the electrolyte 210 and the substrate 300. When the guide member 131 is formed as part of the coating slit part 101, surface tension is formed between the electrolyte 210 and the guide member 131, and more surface tension is formed in a direction toward the front body 111 than the rear body 121. Thus, the electrolyte 210 does not drop vertically and has a smaller angle of incidence with the substrate 300.

When the incidence angle of the electrolyte 210 with respect to the substrate 300 decreases, the force pushing the oil 220 in a side direction decreases, and the oil 220 may remain in the pixel partition 310, so that the electrolyte 210 may be coated over the oil 220. Thus, without repositioning the oil 220, the electrolyte 210 may be coated on the substrate 300.

Figure 3B:
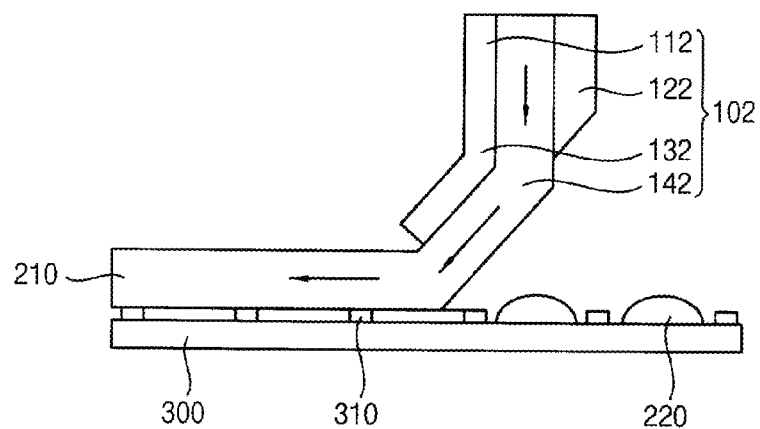

FIG. 3B is a cross-sectional view illustrating a coating slit part in accordance with an exemplary embodiment of the present invention.

Referring to FIG. 3B, the coating slit part 102 includes a front body 112, a rear body 122, a guide member 132, and a discharge nozzle 142. The coating slit part 102 coats the electrolyte 210 provided from the providing part 50 on the substrate 300. The electrolyte 210 provided through the discharge nozzle 142 of the coating slit part 102 is extended in a moving direction of the coating slit part 102 and forms a layer to coat the substrate 300. The coating process, in which the coating slit part 102 receives the electrolyte 210 from the providing part 50 and coats the electrolyte 210 on the substrate 300, is substantially the same as described above with respect to the exemplary embodiment shown in FIG. 3A. Thus, repeated description will be omitted.

The guide member 132 is formed at the end portion of the front body 112 of the coating slit part 102. In the present exemplary embodiment, the guide member 132 is formed at the end portion of the front body 112, and is extended in an inclined direction with respect to the longitudinal direction of the front body 112. Since the coating slit part 102 is extended in a direction substantially perpendicular to the moving direction, the guide member 132 is also extended in the direction substantially perpendicular to the moving direction.

When the guide member 132 is formed at the end portion of the front body 112, the electrolyte 210 has an increased holding distance by the guide member 132. The electrolyte 210 contains water and has a surface tension with the guide member 132, and the incidence angle of the electrolyte 210 with respect to the substrate 300 may be smaller when the electrolyte 210 flows along the guide member 132 than when the electrode 210 flows directly out of the discharge nozzle 141. When the guide member 132 is not formed as part of the coating slit part 102, the electrolyte 210 may flow at a substantially vertical direction with respect to the substrate 300 at the meeting point of the electrolyte 210 and the substrate 300.

When the guide member 132 is extended from the end portion of the front body 112, surface tension is formed between the electrolyte 210 and the guide member 132, and more surface tension is formed in a direction toward the front body 112 than in a direction toward the rear body 122. Thus, the electrolyte 210 does not drop vertically and has a smaller angle of incidence with the substrate 300.

When the incidence angle of the electrolyte 210 with respect to the substrate 300 decreases, the force pushing the oil 220 in a side direction decreases, and the oil 220 may remain in the pixel partition 310, so that the electrolyte 210 may be coated over the oil 220. Thus, without repositioning the oil 220, the electrolyte 210 may be coated on the substrate 300.

Figure 3C:
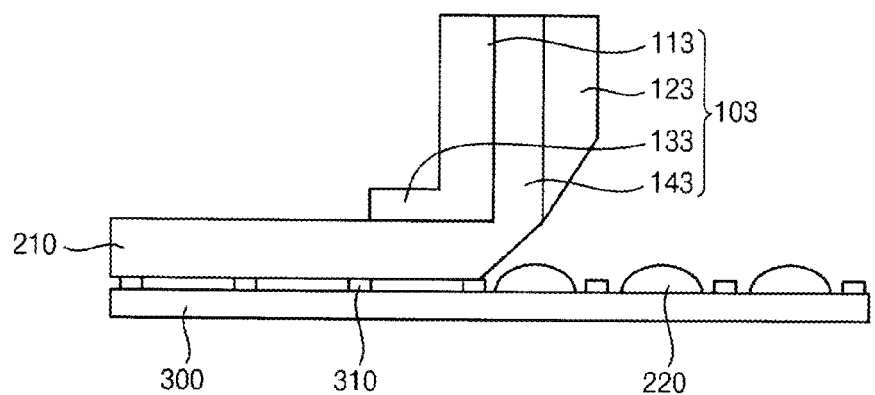

FIG. 3C is a cross-sectional view illustrating a coating slit part in accordance with an exemplary embodiment of the present invention.

Referring to FIG. 3C, the coating slit part 103 includes a front body 113, a rear body 123, a guide member 133, and a discharge nozzle 143. The coating process, in which the coating slit part 103 receives the electrolyte 210 from the providing part 50 and coats the electrolyte 210 on the substrate 300, is substantially the same as described above with respect to the exemplary embodiment shown in FIG. 3A. Thus, repeated description will be omitted.

The guide member 133 is formed at the end portion of the front body 113 of the coating slit part 103. In the present exemplary embodiment, the guide member 133 is formed at the end portion of the front body 113, and is extended in a direction substantially perpendicular to the longitudinal direction of the front body 113. Since the coating slit part 103 is extended in a direction substantially perpendicular to the moving direction of the coating slit part 103, the guide member 133 extends in a direction substantially parallel to the moving direction.

When the guide member 133 is formed at the end portion of the front body 113, the electrolyte 210 has an increased holding distance by the guide member 133. Moreover, in the present exemplary embodiment, since the guide member 133 extends in a direction substantially perpendicular to the longitudinal direction of the front body 113, more surface tension may be formed in the direction of the guide member 133 than the exemplary embodiment shown in FIG. 3B. The electrolyte 210 contains water and has a surface tension with the guide member 133, is and the incidence angle of the electrolyte 210 with respect to the substrate 300 may be smaller when the electrolyte 210 flows along the guide member 133 than when the electrode 210 flows directly out of the discharge nozzle 143. When the guide member 133 is not formed as part of the coating slit part 103, the electrolyte 210 may flow substantially vertical direction with respect to the substrate 300 at the meeting point of the electrolyte 210 and the substrate 300. Moreover, in the present exemplary embodiment, more surface tension is formed by the shape of the guide member 133, and the coating slit part 103 may be disposed closer to the substrate 300 than when the guide member 133 is not formed as part of the coating slit part 103.

When the guide member 133 is extended in a direction substantially perpendicular to the longitudinal direction of the front body 113, the surface tension may be increased between the electrolyte 210 and the guide member 133, and more surface tension is formed in a direction toward the front body 113 than in a direction toward the rear body 123. Thus, the electrolyte 210 does not drop vertically and has a smaller angle of incidence with the substrate 300. Moreover, since the coating slit part 103 may be disposed closer to the substrate 300, the electrolyte 210 may be exposed at a lower height.

When the incidence angle of the electrolyte 210 with respect to the substrate 300 decreases, the force pushing the oil 220 in a side direction decreases, and the oil 220 may remain in the pixel partition 310, so that the electrolyte 210 may be coated over the oil 220. Thus, without repositioning the oil 220, the electrolyte 210 may be coated on the substrate 300.

Figure 3D:
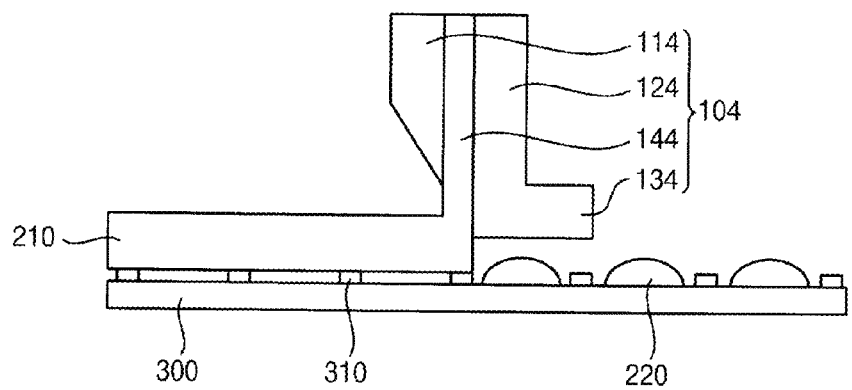

FIG. 3D is a cross-sectional view illustrating a coating slit part in accordance with an exemplary embodiment of the present invention.

Referring to FIG. 3D, the coating slit part 104 includes a front body 114, a rear body 124, a guide member 134, and a discharge nozzle 144. The coating process, in which the is coating slit part 104 receives the electrolyte 210 from the providing part 50 and coats the electrolyte 210 on the substrate 300, is substantially the same as described above with respect to the exemplary embodiment shown in FIG. 3A. Thus, repeated description will be omitted.

The guide member 134 is formed at the end portion of the rear body 124 of the coating slit part 104. In the present exemplary embodiment, the guide member 134 is formed at the end portion of the rear body 124, and is extended in a direction substantially perpendicular to the longitudinal direction of the rear body 124. Since the coating slit part 104 is extended in a direction substantially perpendicular to the moving direction, the guide member 134 is also extended in the direction substantially parallel to the moving direction.

When the guide member 134 is formed at the end portion of the rear body 124, the electrolyte 210 has an increased holding distance by the guide member 134. In the present exemplary embodiment, the guide member 134 is formed at the end portion of the rear body 124. Moreover, in the present exemplary embodiment, since the guide member 134 is extended in a direction substantially perpendicular to the longitudinal direction of the rear body 124, the electrolyte 210 discharged through the discharge nozzle 144 flows along a bottom surface of the guide member 134. The electrolyte 210 flows along the bottom surface of the guide member 134 since the electrolyte 210 contains water and has a surface tension. When the electrolyte 210 flows along the guide member 134, the electrolyte 210 may cover an upper surface of the oil 220. When the guide member 134 is not formed as part of the coating slit part 104, the electrolyte 210 may flow in a substantially vertical direction with respect to the substrate 300 at the meeting point of the electrolyte 210 and the substrate 300.

However, in the present exemplary embodiment, the electrolyte 210 flows to a part of the guide member 134 and may be able to cover the upper surface of the oil 220, and the is oil 220 may be prevented from moving.

When the guide member 134 is extended in a direction substantially perpendicular to the longitudinal direction of the rear body 124, surface tension is increased between the electrolyte 210 and the guide member 134, and the electrolyte 210 is attracted to the upper surface of the oil 220, and the oil 220 may be prevented from moving. Moreover, the incidence angle of the electrolyte 210 with respect to the substrate 300 decreases at the same time.

When the incidence angle of the electrolyte 210 with respect to the substrate 300 decreases, the force pushing the oil 220 in a side direction decreases, and the oil 220 remains in the pixel partition 310, so that the electrolyte 210 may be coated over the oil 220. Thus, without repositioning the oil 220, the electrolyte 210 is coated on the substrate 300.

Figure 3E:
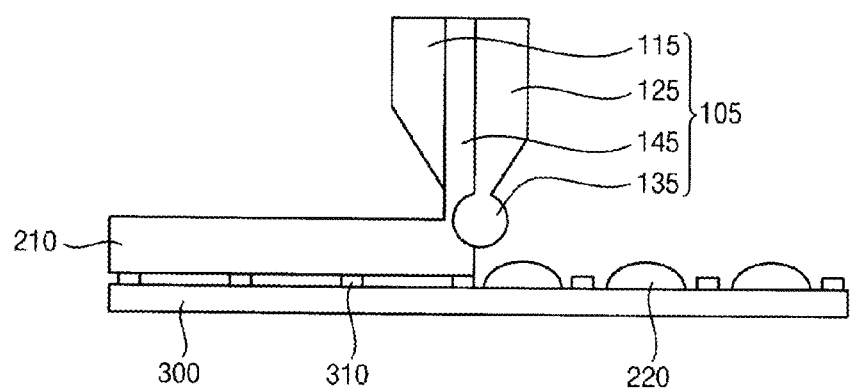

FIG. 3E is a cross-sectional view illustrating a coating slit part in accordance with an exemplary embodiment of the present invention.

Referring to FIG. 3E, the coating slit part 105 includes a front body 115, a rear body 125, a guide member 135, and a discharge nozzle 145. The coating process, in which the coating slit part 105 receives the electrolyte 210 from the providing part 50 and coats the electrolyte 210 on the substrate 300, is substantially the same as described above with respect to the exemplary embodiment shown in FIG. 3A. Thus, repeated description will be omitted.

The guide member 135 is formed at the end portion of the rear body 125 of the coating slit part 105. In the present exemplary embodiment, the guide member 135 is formed at the end portion of the rear body 125, and is formed in a cylindrical shape having a circular cross-section. Since the coating slit part 105 is extended in a direction substantially perpendicular to the moving direction, the guide member 135 is also extended in the direction substantially perpendicular to the moving direction. The cylindrical shape of the guide member 135 is is extended in the direction in which the coating slit part 105 is extended.

When the guide member 135 is formed at the end portion of the rear body 125, the electrolyte 210 has an increased holding distance by the guide member 135. Moreover, the oil 220 may be prevented from escaping upwardly. In the present exemplary embodiment, the guide member 135 is formed at the end portion of the rear body 125. Moreover, in the present exemplary embodiment, since the guide member 135 is formed as a cylindrical shape, the electrolyte 210 discharged through the discharge nozzle 145 flows along a bottom surface of the guide member 135. The electrolyte 210 flows along the bottom surface of the guide member 135 since the electrolyte 210 contains water and has a surface tension with the guide member 135.

Moreover, since the cross-section of the guide member 135 is circular and located at the end portion of the rear body 125, the electrolyte 210 covers an upper surface of the oil 220 at a small incidence angle with respect to the substrate 300. Normally, when the guide member 135 is not formed as part of the coating slit part 105, the electrolyte 210 may flow at a substantially vertical direction at the area where the electrolyte 210 and the substrate 300 meet to each other. Without the guide member 135, the oil 220 may be pushed away when the electrolyte 210 is provided from the side. However, in the present exemplary embodiment, since the upper surface of the oil 220 is covered by the electrolyte 210 with a small incidence angle, the oil 220 may be prevented from moving. The diameter of the cross-section of the guide member 135 may be in a range of about 10 μm to about 10000 μm.

When the guide member 135 is formed at the end portion of the rear body 125 and is formed as a cylindrical shape, the coating apparatus 1000 may have at least the following merits. First, an attraction force between the electrolyte 210 and the bottom surface of the guide member 135 is formed, and the electrolyte 210 is attracted to the top or the upper surface of the is oil 220, so that the oil 220 may be prevented from moving. Second, the attracting force between the guide member 135 and the electrolyte 210 may decrease the incidence angle of the electrolyte 210 with respect to the substrate 300. Third, since the guide member 135 covers the upper surface of the oil 220 and is formed as a cylindrical shape, the oil 220 may be prevented from moving.

Figure 4:
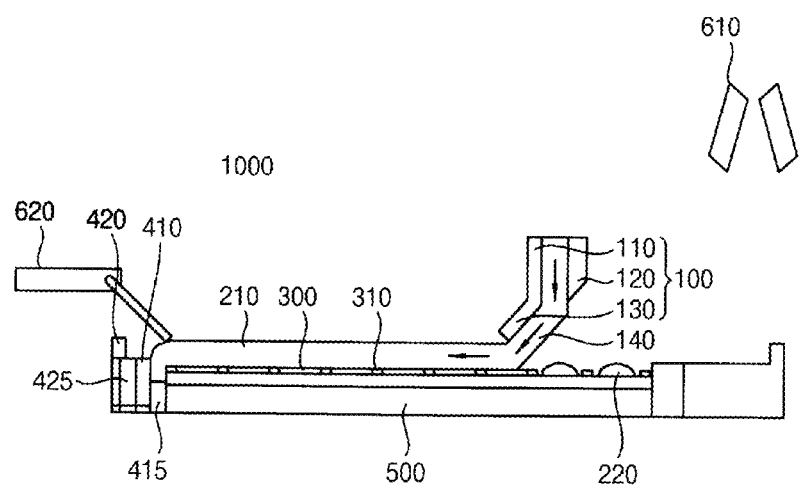
FIG. 4 is a cross-sectional view of a coating apparatus according to an exemplary embodiment of the present invention.

FIG. 4 is a cross-sectional view of a coating apparatus according to an exemplary embodiment of the present invention.

Referring to FIG. 4, a coating apparatus 1000 of the present exemplary embodiment includes a providing part (not shown), a coating slit part 100, holding walls 410 and 420, a stage 500, an air knife 610, and a vacuum 620. The coating apparatus 1000 illustrated in FIG. 4 is substantially the same as the coating apparatus illustrated in FIG. 2 except the air knife 610 and the vacuum 620. The same numeric references are used for the same components, and the repeated description are omitted.

The air knife 610 removes the remains after coating the substrate 300. In particular, the air knife 610 removes the unnecessary substances on the substrate 300 by air.

In a method for manufacturing an EWD, in which the coating apparatus of the present exemplary embodiment, a TFT and a pixel partition, are formed on a lower substrate and oil may be disposed inside the pixel partition using an inkjet injection apparatus. After disposing the oil inside the pixel partition on the lower substrate, an electrolyte is coated on the oil and the lower substrate. In the EWD, since a liquid having hydrophilic property is coated on oil having hydrophobic property, an electrolyte is used. After coating the electrolyte, an upper substrate is combined with the lower substrate. The EWD is manufactured by combining the lower and upper substrates.

In the combining process, the electrolyte layer is formed sufficiently higher than a gap between the lower and upper substrates, so that air bubbles are not generated between the substrate. Before the combining process, the normal height of the electrolyte may be about 3 mm. The gap between the upper and lower substrates is very small after combining, and may be less than 3 mm. Thus, the electrolyte may overflow from the EWD during the combining process. After combining, the over-flowed electrolyte needs to be removed. The air knife 610 is used for removing the over-flowed electrolyte.

After combining the lower substrate and the upper substrate, the stage 500 is moved. The stage 500 is moved at the position where the air knife 610 is disposed. The air knife 610 facing the substrate among the installed air knives is operated, and the air knife 610 removes the electrolyte 210 disposed on the substrate or around the substrate. During removing the electrolyte 210, the electrolyte 210 is drained through an upper drain 425 and lower drain 415 disposed under the holding walls 410 and 420.

The upper drain 425 drains the electrolyte 210 when the electrolyte 210 is removed by the air knife 610 after combining the upper substrate and the lower substrate.

After removing the electrolyte 210, the panel, which is the combination of the upper and lower substrates, is removed from the stage 500. The stage 500 is prepared for the next coating process, and the remaining electrolyte 210 may be disposed on the stage 500. Thus, the stage 500 is moved back through a second air knife 610, which faces the opposing direction of the first air knife 610. The second air knife 610 removes the electrolyte 210 on the stage 500. The removed electrolyte 210 removed by the second air knife 610 is gathered at the opposite wall. When the second air knife 610 is used on the stage 500, the lower drain 415 is used.

The vacuum 620 partially removes the electrolyte 210 throughout the coating is process of the coating apparatus 1000. The vacuum 620 may move to various positions, and moves at proper positions and heights and remove unnecessary or excess electrolyte 210 by vacuum pressure. When some electrolyte 210 is not removed by the upper and lower drains 415 and 425, the vacuum 620 may be used for removing the electrolyte 210.

Figure 5:
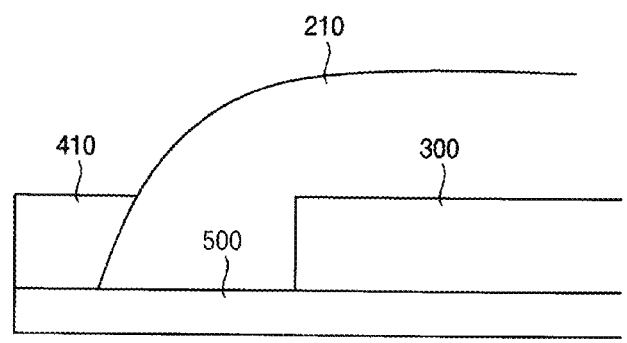
FIG. 5 is a cross-sectional view illustrating a part of the coating apparatus shown in FIG. 4.

FIG. 5 is a cross-sectional view illustrating a part of the coating apparatus 1000 shown in FIG. 4.

Referring to FIG. 4 and FIG. 5, the coating apparatus 1000 according to the present exemplary embodiment includes holding walls 410 and 420 at the peripheral area of the stage 500. The holding wall includes an upper holding wall 410 and a lower holding wall 420. The holding walls 410 and 420 may prevent the electrolyte 210 from partial lifting up by surface tension during the coating process, and the holding walls 410 and 420 may prevent the electrolyte 210 from overflowing from the stage 500.

The lower holding wall 410 is used when the electrolyte 210 is coated on the substrate 300. The electrolyte 210 coated on the substrate 300 contains a water and has surface tension with the substrate. When the electrolyte 210 is coated on the substrate 300, the electrolyte 210 may have different heights at the center part and peripheral part of the substrate 300 because of the surface tension. Moreover, even using enough volume of the electrolyte 210 to cover the entire substrate 300, since the electrolyte 210 is gathered by the surface tension, the electrolyte 210 may be coated un-uniformly.

In order to solve the un-uniform distribution of the electrolyte 210, more electrolyte 210 may be provided. When the electrolyte 210 is provided in excess, accurate horizontality may be hard to find. Thus, by using the lower holding wall 410, the electrolyte 210 coated on the substrate 300 may be distributed wider and more uniformly.

Referring to FIG. 5, the lower holding wall 410 is separated from the substrate 300. As well as being disposed on the substrate 300, the electrolyte 210 is coated to cover an area of the lower holding wall 410. When the holding wall 410 contacts with the electrolyte 210, the curvature formed by the surface tension of the electrolyte 210 becomes gentle and the electrolyte 210 may be coated more uniformly.

Moreover, less electrolyte 210 is needed to form uniform distribution, and the height of the electrolyte 210 is lowered. Without the holding wall 410, the height of the electrolyte 210 may be more than about 3 mm. With the holding wall 410, the height of the electrolyte 210 may be less than about 3 mm. Even when the electrolyte 210 is not distributed with an accurate horizontality, the substrate 300 may be coated by using the holding wall 410.

Figure 6:
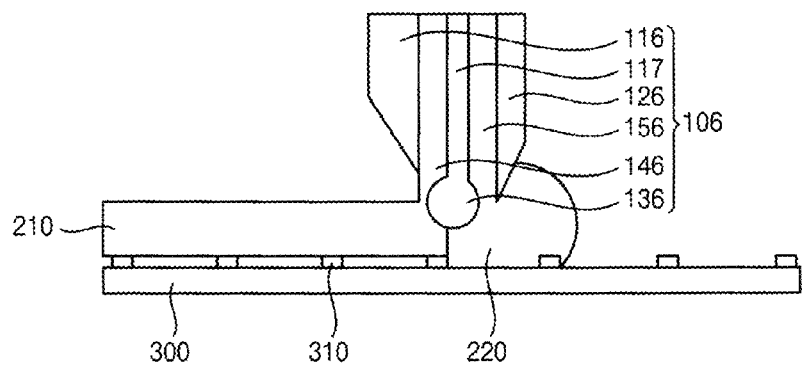
FIG. 6 is a cross-sectional view illustrating an exemplary embodiment of the present invention.

FIG. 6 is a cross-sectional view illustrating an exemplary embodiment of the present invention.

Referring to FIG. 6, the coating slit part 106 includes a front body 116, a center body 117, a rear body 126, a guide member 136, a rear discharge nozzle 146, and a front discharge nozzle 156. The oil 220 and the electrolyte 210 are coated at the same time in the present exemplary embodiment. The electrolyte 210 is provided through the rear discharge nozzle 146, and the oil 220 is provided through the front discharge nozzle 156.

The substrate 300 includes only the pixel partition 310, and the oil 220 is coated when the electrolyte 210 is coated. The coating process may be simplified since an additional oil coating process is not needed. The electrolyte 210 and the oil 220 provided through the coating slit part 106 are separated by the guide member 136, and the electrolyte 210 and the oil 220 are not mixed or inverted.

The guide member 136 is formed at an end portion of the center body 117 of the is coating slit part 106. In the present exemplary embodiment, the guide member 136 is formed as a cylindrical shape having a circular cross-section. The coating slit part 106 is extended in a direction substantially perpendicular to the moving direction of the coating slit part 106, and the guide member 136 is also extended in a direction substantially perpendicular to the moving direction, and the cylindrical shape of the guide member 136 is also extended in the substantially perpendicular direction.

When the guide member 136 is formed at the end portion of the center body 117, the guide member 136 may functions similarly as the embodiment shown in FIG. 3E. The electrolyte 210 provided by the guide member 136 flows along the bottom part of the guide member 136, and the oil 220 is prevented from moving over the electrolyte 210 by the cylinder-shaped guide member 136.

Since the cross section of the guide member 136 is circular, the guide member 136 controls the height of the oil 220, so that the oil 220 does not overflow from the substrate 300. The guide member 136 moves in the moving direction of the coating slit part 106 and pushes the oil 220, which is higher than the guide member 136, so as to secure the space of the electrolyte 210. The electrolyte 210 provided through the rear discharge nozzle 146 is provided on the oil 220. The diameter of the cylindrical-shaped guide member 136 may be between about 10 μm to about 10000 μm. The bottom of the front body 116 may be formed higher than the bottom of the rear body 126. That is, the bottom of the front body 116 may be formed further from the substrate 300 than the bottom of the rear body 126. Since the height of the electrolyte 210 may be different from the height of the oil 220, the height of the bottoms of the front body 116 and the rear body 126 can control the electrolyte 210 and the oil 220 respectively.

When the guide member 136 is formed at the end portion of the center body 117 is and is formed as a cylinder shape, the guide member 136 may have various roles. Firstly, the guide member 136 causes an attraction forces between the electrolyte 210 and the bottom of the guide member 136, and attracts the electrolyte 210 to the top of the oil 220 or around the top of oil 220, and the oil 220 may be prevented from moving. Secondly, the guide member 136 limits the height of the oil 220 and secures the spaces of the electrolyte 210. With one coating process, the oil 220 and the electrolyte 210 are coated on the substrate 300.

Figure 7:
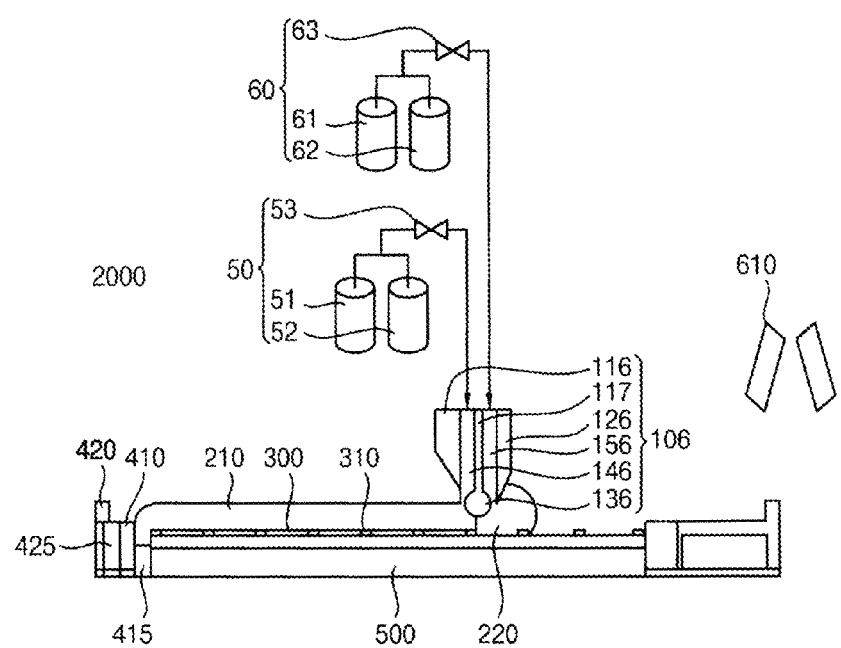
FIG. 7 is a cross-sectional view illustrating a coating apparatus having the coating slit part shown in FIG. 6.

FIG. 7 is a cross-sectional view illustrating a coating apparatus having the coating slit part shown in FIG. 6.

Referring to FIG. 7, a coating apparatus 2000 in accordance with the present exemplary embodiment, includes a first providing part 50 and a second providing part 60, a coating slit part 106, holding walls 410 and 420, a stage 500, and an air knife 610. Except for the second providing part 60 and the coating slit part 106, the coating apparatus 2000 includes substantially the same components as the embodiments shown in FIG. 2 or FIG. 4. The same numeric references are used with the same components, and repeated descriptions are omitted.

The first providing part 50 includes storage tanks 51 and 52 and an adjusting valve 53. The first providing part 50 provides the materials of the storage tanks 51 and 52 to the coating slit part 106. The second providing part 60 includes storage tanks 61 and 62 and an adjusting valve 63. The second providing part 60 provides the materials of the storage tanks 61 and 62 to the coating slit part 106. The first providing part 50 may provide the electrolyte 210, and the second providing part 60 may provide the oil 220. The necessary materials may be stored to the storage tanks 51, 52, 61, and 62 to coat various coating materials.

The coating slit part 106 coats the electrolyte 210 and the oil 220 on the substrate 300 at substantially the same time. The electrolyte 210 and the oil 220 are simultaneously is provided to the coating slit part 106, and the coating slit part 106 is moved on the substrate 300 in a constant direction. The substrate 300 includes only pixel partitions 310 without the oil 200 initially, and the substrate 300 is mounted on the stage 500. Thus, without an additional oil coating process, the electrolyte 210 and the oil 220 are coated on the substrate 300 simultaneously.

Figure 8A:
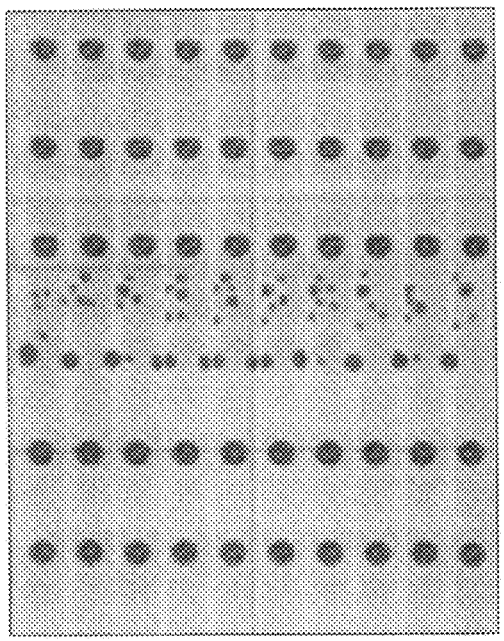
FIG. 8A and FIG. 8B are plan views illustrating substrates manufactured by a conventional manufacturing method and a manufacturing method according to an exemplary embodiment of the present invention, respectively.
Figure 8B:
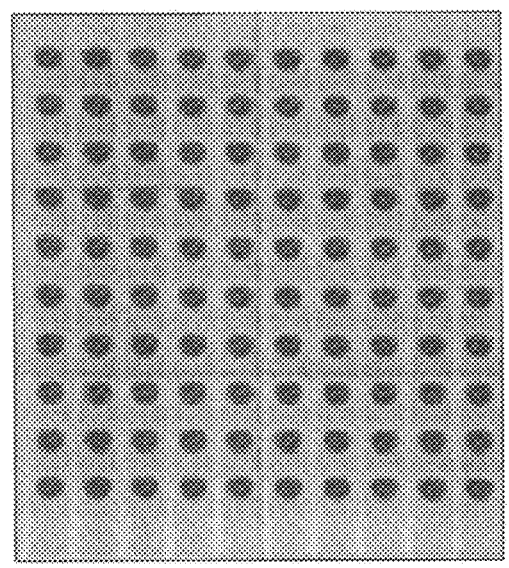

FIG. 8A and FIG. 8B are plan views illustrating substrates manufactured by a conventional manufacturing method and by a manufacturing method according to an exemplary embodiment of the present invention.

Referring to FIG. 8A, when a normal coating slit, which has no guide members, is used, the oil (i.e., the dark portions) is moved to adjacent pixel areas. Thus, the oil is lacking or absent in some pixel areas, and the oil is excessive in other pixel areas. Without uniform oil distribution, the EWD may not work properly.

Referring to FIG. 8B, when using the coating slit according to the exemplary embodiment of the present invention, the oil is not moved to adjacent pixel areas. Thus, the EWD may be mass-produced using the method of the exemplary embodiment of the present invention.

As described above, according to exemplary embodiments of the present invention, an electrolyte is coated on oil without displacing the oil to other pixel areas. Thus, an EWD may be manufactured efficiently.

Moreover, the electrolyte may be controlled by using holding walls, and the electrolyte may be spread more uniformly and lower height of the electrolyte may be maintained.

Moreover, the oil and the electrolyte may be formed on the substrate at the same time, and the manufacturing process simplified.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A coating apparatus, comprising:
a stage configured to receive a substrate;
a coating slit part configured to apply coating materials to the substrate, the coating slit part comprising:
    a first body;
    an opposing second body;
    a third body arranged between the first body and the second body, the first, second, and third bodies forming a discharge nozzle through which the coating materials are discharged; and
    a guide member that extends from an end portion of the third body and away from the discharge nozzle; and
a providing part configured to provide the coating materials to the coating slit part,
wherein:
    the discharge nozzle comprises:
    a first discharge nozzle formed by the first body and the guide member extended from the end portion of the third body; and
    a second discharge nozzle formed by the second body and the guide member extended from the end portion of the third body so that the coating materials are separately discharged;
    the guide member is configured to extend toward the substrate so as to be closer to the substrate than the first and second bodies; and
    a width of a cross-section of the guide member is greater than a width of a cross-section of the third body.

2. The coating apparatus of claim 1, wherein the coating materials comprise an electrolyte.

3. The coating apparatus of claim 1, wherein the guide member comprises a cylindrical shape having a circular cross-section.

4. The coating apparatus of claim 3, wherein a diameter of the cross-section of the guide member is in a range of about 10 μm to about 10000 μm.

5. The coating apparatus of claim 1, further comprising:
a holding wall arranged at a peripheral area of the stage, the holding wall configured to hold the coating materials on the stage.

6. The coating apparatus of claim 5,
wherein the holding wall comprises a first holding wall and an second holding wall, and
the holding wall further comprises a second drain configured to drain the coating materials held by the second holding wall and a first drain configured to drain the coating materials held by first holding wall.

7. The coating apparatus of claim 1, wherein:
the first discharge nozzle is configured to discharge an oil; and
the second discharge nozzle is configured to discharge an electrolyte.

8. The coating apparatus of claim 1, wherein a bottom of the first body is arranged further from the substrate than a bottom of the second body.

* * * * *